(12) United States Patent
Dingman

(10) Patent No.: US 6,357,603 B1
(45) Date of Patent: Mar. 19, 2002

(54) SYSTEM AND METHOD FOR SECURING A CARD WITHIN A COMPUTER CHASSIS

(75) Inventor: Gerald A. Dingman, Sacramento, CA (US)

(73) Assignee: GlobalStreams, Inc., Emeryville, CA (US)

(*) Notice: Subject to any disclaimer, the term of this patent is extended or adjusted under 35 U.S.C. 154(b) by 0 days.

(21) Appl. No.: 09/538,927

(22) Filed: Mar. 30, 2000

Related U.S. Application Data

(60) Provisional application No. 60/127,518, filed on Apr. 2, 1999.

(51) Int. Cl.[7] ............................................. A47G 19/08
(52) U.S. Cl. .................. 211/41.17; 211/26; 312/223.2; 361/683; 361/759; 361/801
(58) Field of Search .............................. 211/26, 41.17; 361/683, 759, 784, 788, 801; 312/223.2; 439/327

(56) References Cited

U.S. PATENT DOCUMENTS

| | | | | | |
|---|---|---|---|---|---|
| 4,214,292 A | * | 7/1980 | Johnson | ............... | 211/41.17 X |
| 5,317,483 A | * | 5/1994 | Swindler | ................... | 361/801 |
| 5,757,618 A | * | 5/1998 | Lee | ........................ | 361/759 X |
| 5,967,466 A | * | 10/1999 | Osborne et al. | | |
| 5,986,892 A | * | 11/1999 | Hargy, III | ................... | 361/759 |
| RE36,695 E | * | 5/2000 | Holt | ................... | 312/223.2 X |
| 6,129,556 A | * | 10/2000 | Sihn et al. | | |
| 6,138,839 A | * | 10/2000 | Cranston, III et al. | ... | 211/41.17 |
| 6,147,874 A | * | 11/2000 | Burbano et al. | ........ | 361/801 X |
| 6,158,594 A | * | 12/2000 | Boe | ........................ | 211/41.17 |
| 6,173,843 B1 | * | 1/2001 | Christensen et al. | ..... | 211/41.17 |

* cited by examiner

Primary Examiner—Robert W. Gibson, Jr.
(74) Attorney, Agent, or Firm—Carr & Ferrell LLP

(57) ABSTRACT

A system and method are disclosed for reliably, securely, and conveniently securing a computer card within a computer chassis. According to one embodiment, the computer card is first secured to a card bracket that includes an upper lip and a bottom tab. The card bracket is then mounted on the computer chassis by inserting the upper lip in an upper lip aperture formed in the computer chassis and inserting the bottom tab in a slot formed in the chassis. After the computer cards at issue have been thus mounted in the computer chassis, an elongated capture member is lowered into engagement with top portions of the card brackets and fastened to the chassis to sandwich the card bracket top portions between the computer chassis and the capture member. The capture member is pivotally secured to the chassis by a hinge to permit the capture member to be selectively pivoted into and out of engagement with the card brackets. When the capture member is positioned in a lowered position and in engagement with the card bracket top portions, the capture member is secured in that position by advancing captive fasteners maintained by the capture member into threaded apertures in the computer chassis.

21 Claims, 6 Drawing Sheets

SYSTEM AND METHOD FOR SECURING A
CARD WITHIN A COMPUTER CHASSIS

This application claims benefit of Provisional Application Ser. No. 60/127,518 filed Apr. 2, 1999.

BACKGROUND OF THE INVENTION

1. Field of the Invention

The present invention relates generally to computers and data processing systems and, more particularly to a system and method by which a card may be conveniently and reliably secured within a chassis of a computer or data processing system.

2. Description of the Background Art

Today, many computers and other data processing devices employ computer cards, such as, expansion cards, adapters, PC boards, or other boards having electrical circuitry disposed thereon. These cards, or boards, are typically mounted to a computer motherboard in a perpendicular fashion relative to the computer motherboard. In particular, the cards are usually inserted into edge card connectors, which are mounted on the computer motherboard.

Merely inserting a card into an edge card connector is typically insufficient to securely maintain the card within the computer chassis. A card connected in this fashion could easily disconnect from the edge card connector, which may prevent, or significantly inhibit, acceptable operation of the computer. Accordingly, additional structure is normally required to secure a card within a computer chassis.

One conventional manner of securing a card within a computer chassis is to provide a card bracket fastened to the computer chassis via a removable screw. Specifically, each mounting bracket is normally disposed across a card slot formed in the chassis and may contain an aperture through which the fastener screw may pass. An added advantage of using conventional card mounting brackets positioned over the card slots is that the brackets substantially prevent unacceptable levels of radio frequency energy (RF) emitted by the computer's electrical circuits from escaping the computer chassis via the card slots.

However, securing a card-mounting bracket to a computer chassis using a screw that passes though the bracket and into the computer chassis may present problems. One significant disadvantage of a screw-secured bracket is that the screw is often inadvertently dropped into the computer chassis during bracket installation and removal.

A common technique for retrieving a dropped screw is to physically lift up the computer chassis, invert the chassis, and shake the chassis until the lost screw falls out of the chassis. Those skilled in the art will appreciate that shaking the computer chassis when the computer is inverted is highly cumbersome and may cause certain computer components to become loose, detached, or damaged.

A further disadvantage of using a screw-secured bracket is that a separate tool (i.e. a screwdriver) is often required to fasten and unfasten the screw. Furthermore, a particular type of tool, such as a Philips or flat-head screwdriver, may be necessary. In such a case, the user is forced to obtain the proper tool in order to engage or disengage the screw.

Because it is frequently difficult or cumbersome to secure card mounting brackets in the manner described above, some individuals choose to not utilize the screws, thus significantly lessening the functionality of the brackets. Indeed, in instances where the screw is not used at all to secure the bracket to the chassis, a gap may form between the bracket and the chassis, thus permitting escape of RF energy though the gap. The likelihood of the card becoming disconnected from its edge card connector is also substantially increased in instances where the screw is not employed.

A further disadvantage of conventional designs is that they require a separate screw for each bracket. In many instances, a given computer chassis will have multiple card slots with each of the card slots being covered by a separate bracket. Consequently, to remove all of the cards, and thus all of the brackets, the screw for each bracket must be individually removed. Such removal of each screw is quite cumbersome and time-consuming.

An alternative to the single screw-secure bracket design, is to utilize multiple screws for each bracket. These screws may pass though the outside of the computer chassis toward the inside of the chassis so as to prevent inadvertently dropped screws from falling into the chassis interior. This design is cumbersome in that it requires at least two screws, one on the top and one near the bottom of each bracket. As a result, individuals will sometimes only use one of the two screws to secure the bracket and thereby permit RF to escape near the unsecured end of the bracket.

Consequently, a need exists for a system and method for reliably and conveniently securing a computer card within a computer chassis.

SUMMARY OF THE INVENTION

The present invention overcomes or substantially alleviates prior problems associated with securing computer cards within a computer chassis. In general, the present invention provides a capture member for securing a plurality of card brackets, and thus cards, within a computer chassis.

The capture member is removably positioned over a plurality of card brackets and cards and is selectively secured to the computer chassis to reliably secure the card brackets, and thus the cards, within the chassis. In one embodiment, the capture member comprises an elongated member secured to the computer chassis adjacent the chassis card slots in a hinged fashion to permit the capture member to selectively pivot into and out of contact with the card brackets. The capture member includes a retaining flange, which further prevents movement of the card bracket. The capture member further includes at least one fastener for fastening the capture member to the computer chassis over the card brackets or cards. This capture member fastener preferably comprises a captive fastener so that the capture member may be pivoted away from the card brackets without the risk of losing the fastener.

In addition, the present invention provides an improved card bracket comprising a downwardly directed lip positioned adjacent to a top portion of the bracket for engaging a lip aperture formed in the computer chassis. Inserting the bracket lip into one of the lip apertures significantly limits or eliminates lateral movement of the bracket within the computer chassis, thus further securing the card brackets and the associated cards within the computer chassis. Additionally, a tab formed on the bottom portion of the bracket is provided, which can be inserted into a slot on the chassis to further limit bracket movement within the chassis.

Other advantages and features of the present invention will be apparent from the drawings and detailed description as set forth below.

DETAILED DESCRIPTION OF THE PREFERRED EMBODIMENT

Figure 1:
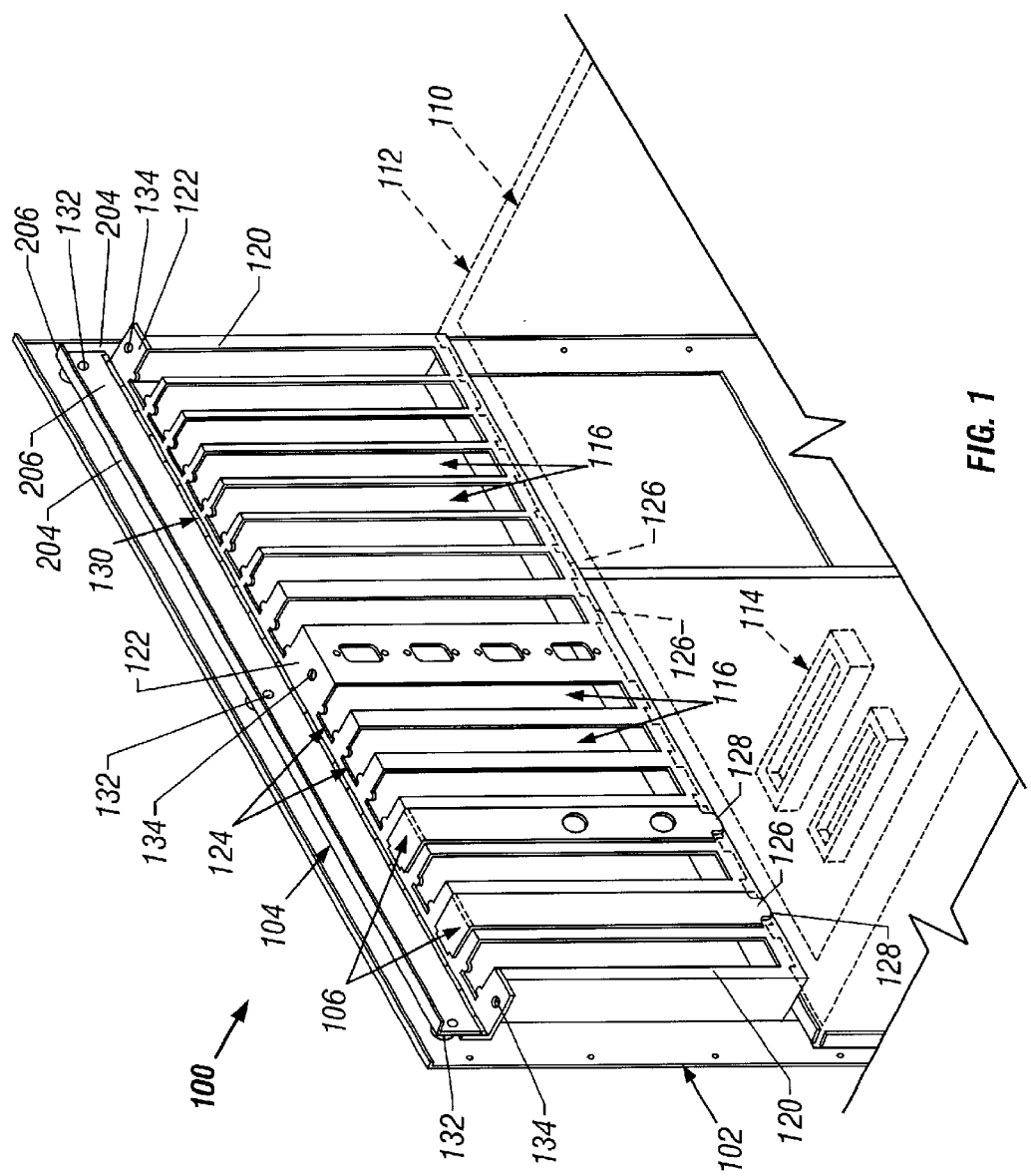
FIG. 1 is an isometric view of a capture member pivotally attached to a computer chassis having card mounting brackets positioned thereon in accordance with the present invention.

FIG. 1 is an isometric view of a card bracket capture assembly 100 according to the present invention. As illustrated, the assembly 100 generally includes a computer chassis 102, a capture member 104, and card brackets 106. The computer chassis 102 includes a motherboard 110, which is supported by a chassis floor or base plate 112. The motherboard 110 is advantageously secured to, and maintained in spaced relation with, the chassis floor 112 by standoffs (not shown). In addition, the motherboard 110 includes multiple edge card connectors 114 (shown in phantom lines) mounted thereon to receive computer cards (not shown).

The card brackets 106 fit onto the computer chassis 102 so as to be positioned over card slots 116 formed in the computer chassis 102. As shown, the card slots 116 are openings formed in a vertical plate 120 and in a horizontal plate 122, which may be attached to or formed integrally with the computer chassis 102. The portion of the card slot 116 formed in the horizontal plate includes a lip aperture 124 for receiving a card bracket lip. Details of the lip aperture 124 and the card bracket lip are discussed in more detail below.

The chassis floor 112 is adapted with a series of slots 126, each sized to receive a tab 128 formed at a bottom end of each card bracket 106. Thus by inserting the tab 128 of a card bracket 106 into the slot 126, the card bracket 106, particularly the bottom portion of the bracket 106, is more secure within the chassis 102.

Figure 2:
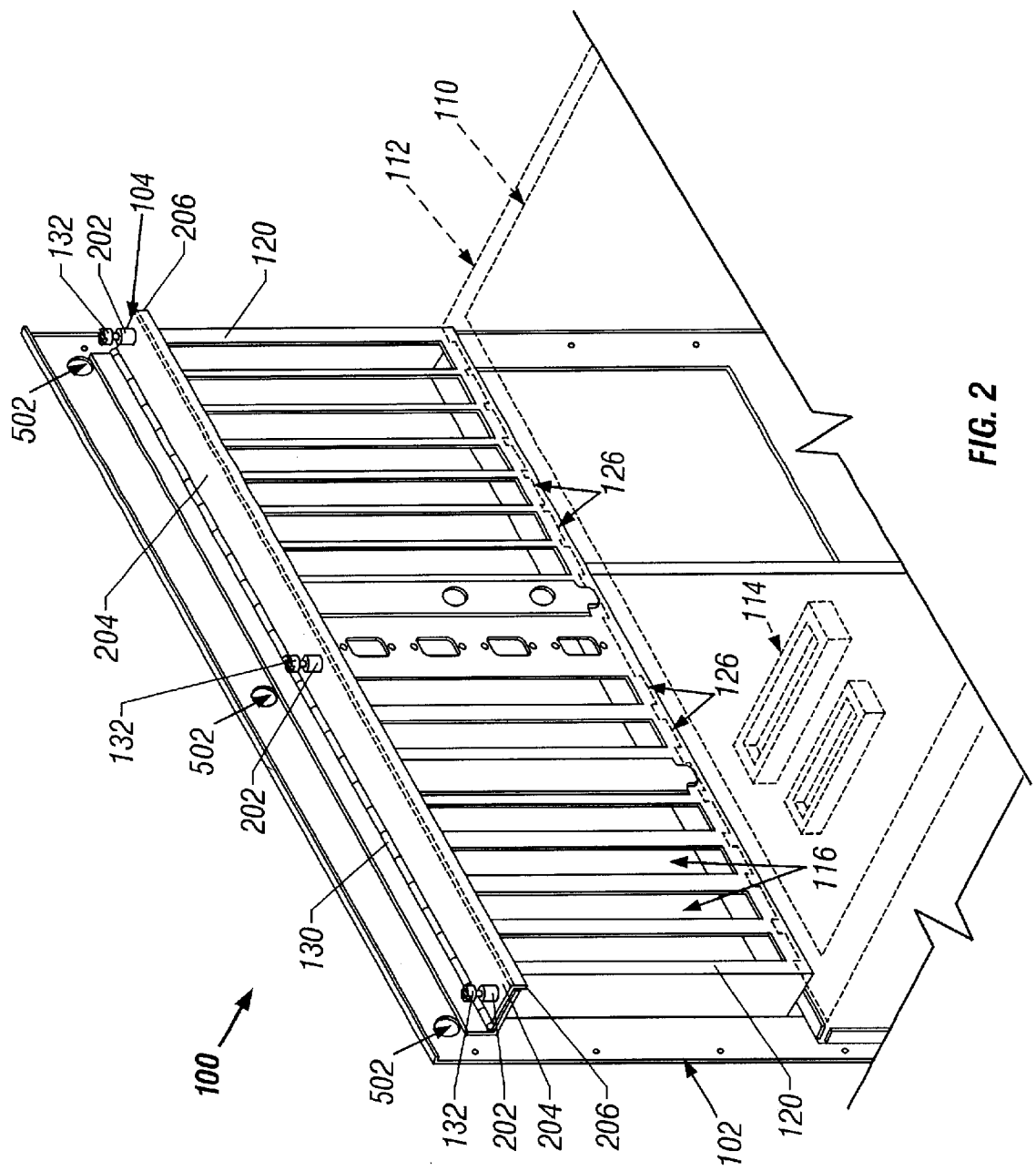
FIG. 2 is an isometric view of the capture member of FIG. 1 positioned in a closed position.

In FIG. 1, the capture member 104 is illustrated as being pivotally connected to the chassis 102 via a hinge 130. In this configuration, when the capture member 104 is positioned in a lowered or closed position (as shown in FIG. 2), the capture member 104 is disposed over, and preferably in tight contact with, the card brackets 106, thus securing the card brackets 106 within the computer chassis 102. The capture member 104 may also be pivoted up and away from the card brackets 106 (as shown in FIG. 1) to provide quick and convenient access to the card brackets 106 for removal of the card brackets 106 from the card slots 116, and subsequent removal of the computer cards (not shown) connected to the edge card connectors 114.

The capture member 104 is further adapted with at least one fastener 132, which may be fastened through a threaded aperture 134 formed in the horizontal plate 122 to facilitate the securing of the capture member 104 over the card brackets 106. The fastener 132 preferably comprises a captive fastener so that the fastener 132 remains coupled to the capture member 104 when disengaged from the threaded aperture 134 as shown in FIG. 1. Thus, the captive fastener is prevented from inadvertently dropping into an interior portion of the computer chassis or otherwise misplaced.

FIG. 2 illustrates the capture member 104 in a closed or lowered position. When the capture member 104 is positioned as shown in FIG. 2, the fastener 132 may be inserted into the threaded aperture 134 (FIG. 1) to securely position the card brackets 106 (FIG. 1) against the computer chassis 102. Different numbers of fasteners 132 may be utilized for securing the capture member 104. However, as shown in FIG. 2, two end fasteners 132 and a middle fastener 132 are presently preferred.

FIG. 2 also shows each fastener 132 disposed in a cylindrical boss 202 mounted on the capture member 104. Because each fastener 132 preferably comprises a captive fastener, each associated boss 202 retains the fastener 132 even when the fastener 132 is disconnected from the threaded aperture 134 to prevent the fastener 132 from being inadvertently dropped or misplaced.

FIGS. 1 and 2 also illustrate the capture member 104 as being elongated and substantially L-shaped. Advantageously, the capture member 104 has a length sufficient to span multiple card slots 116 in the computer chassis 102. With such a length, a single capture member 104 may secure multiple or all the card brackets 106 within the computer chassis 102, thus facilitating installation and removal of computer cards and the associated card brackets within a computer chassis.

Regarding the L-shaped cross-section of the capture member 104, the capture member 104 is shown as including an arm 204 and a retaining flange 206 oriented substantially orthogonal or perpendicular to the arm 204. As illustrated, the arm 204 is pivotally secured to the chassis 102 by the hinge 130, while the flange 206 is connected to, or formed integrally with, the arm 204 opposite the hinge 130. In this configuration, when the capture member 104 is lowered to the down or closed position shown in FIG. 2, the arm 204 rests on the top surface of the card brackets 106 to prevent displacement of the card brackets 106 within the chassis 102. In addition, the retaining flange 206 prevents the card brackets 106 from moving laterally away from the computer chassis 106, and preferably gently contacts a back surface of the card brackets 106.

Figure 3:
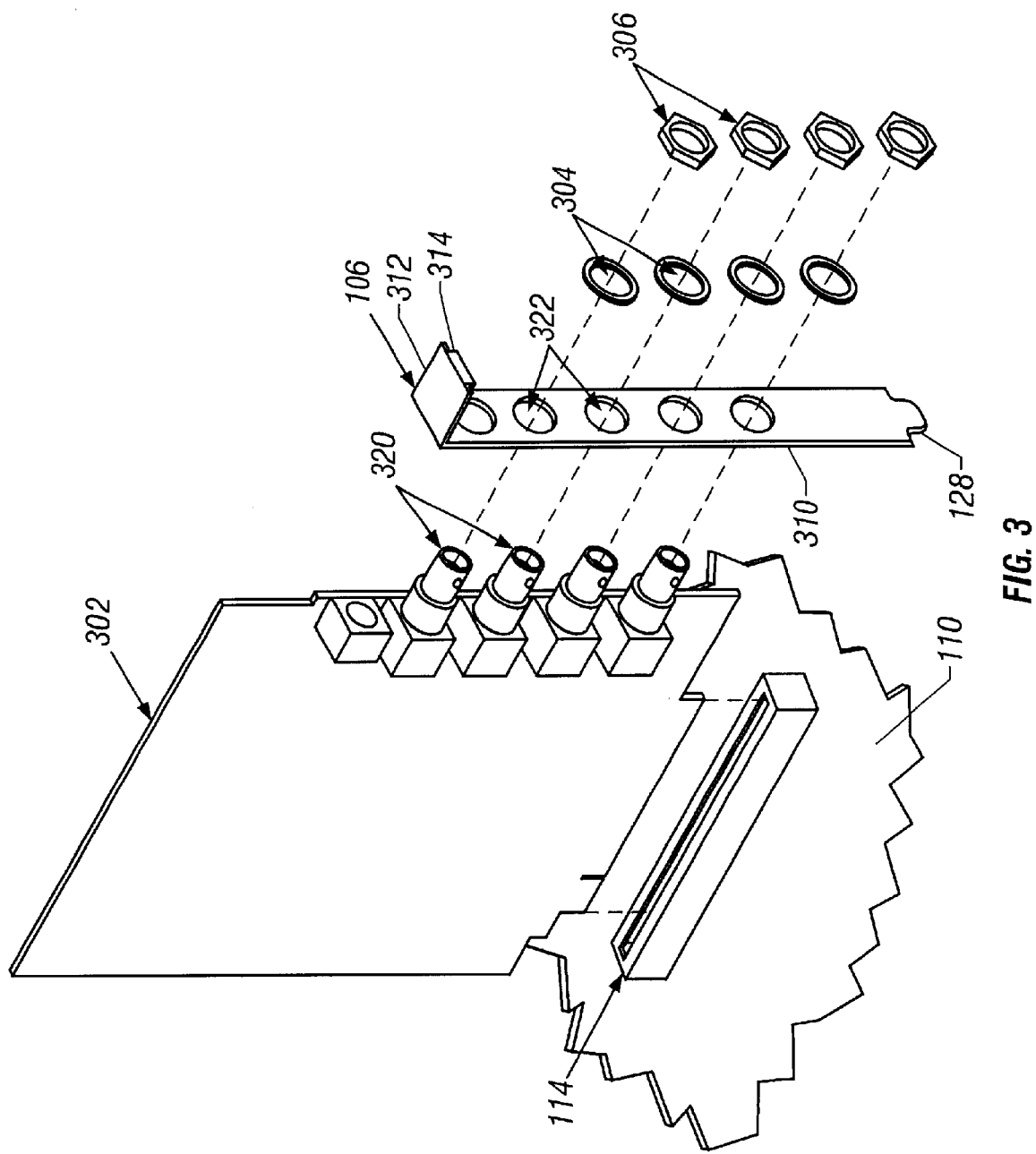
FIG. 3 is an exploded perspective view of a computer card and a FIG. 1 card bracket.

FIG. 3 illustrates, in an exploded isometric view, a computer card 302, a card bracket 106, washers 304, nuts 306, and edge card connector 114. As shown, the card bracket 106 includes a relatively long base portion 310 and a shorter top portion 312 with the base portion 310 and the top portion 312 being oriented substantially perpendicular to each other. In addition, the card bracket 106 includes a downwardly directed lip 314 that is sized and shaped to fit securely within one of the lip apertures 124 (FIG. 1) formed in the computer chassis 102. The card bracket 106 also includes a tab 128 sized and shaped to fit securely within one of the slots 126 of the computer chassis 102. The tab 128 is shown as being formed integrally with the base portion 310 opposite the top portion 312 and has a width less than that of the base portion 310.

The computer card 302 may comprise an expansion card, an adapter card, a PC board, or other boards having electrical circuitry disposed thereon and is configured to be inserted into an edge card connector 114 mounted perpendicularly on a computer motherboard 110 (FIG. 1). Electrical connectors 320 are coupled to the card 302 to permit card input, output, or both. These connectors 320 extend through apertures 322 located in the base portion 310 of the bracket 106, which are sized to tightly permit the connectors 320 to pass therethrough. Subsequent to the insertion of the connectors 320 through the apertures 322, the washers 304 and the nuts 306 secure the card 302 to the card bracket 106. Although FIG. 3 shows four circular apertures 322, the bracket 106 may include different numbers and shapes of apertures 322 or no aperture at all.

Once the card 302 has been thus connected to the card bracket 106, the card 302 is then connected to the edge card connector 114 of the motherboard 110. During the connection process, the card bracket tab 128 is inserted into the associated slot 126 (FIG. 1), while the card bracket lip 314 is positioned into the corresponding lip aperture 124. When all the cards 302 are coupled to their respective edge card connectors 114, the capture member 104 is pivoted from the raised position shown in FIG. 1 to the lowered position shown in FIG. 2. The fasteners 130 are then advanced into the threaded apertures 134 to secure the card brackets 106, and thus the associated cards 302, within the computer chassis 102.

Figure 4:
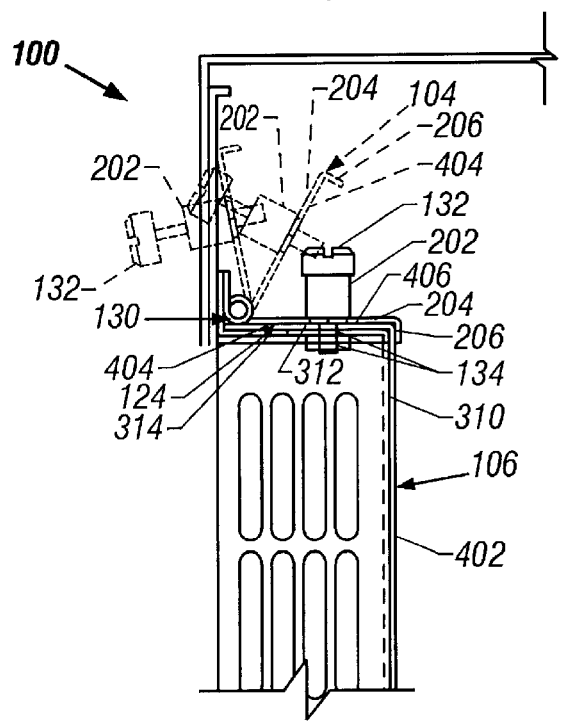
FIG. 4 is a side elevation view of the capture member of FIG. 1 and illustrates the capture member range of motion.

FIG. 4 is a side elevation view of the capture member 104 and illustrates the range of motion of the capture member 104. As shown, the capture member 104 may be lowered from the positions illustrated in phantom lines into contact with the top portion 312 of the card bracket 106. In addition, when the capture member 104 is in the lowered position, the capture member retaining flange portion 206 contacts a back surface 402 of the base portion 310 of the card bracket 106. Likewise, a capture member arm bottom surface 404 contacts a top surface 406 of the card bracket top portion 312 when the capture member 104 is in the lowered position. Thus, in the lowered position, the capture member 104 reliably secures the card brackets 106 within the chassis 102.

In phantom lines, FIG. 4 also shows the capture member 104 in raised position out of contact with the card bracket 106. As discussed above, when the capture member 104 is raised out of contact with the card bracket 106, the card bracket 106, and thus the associated card 302 (FIG. 3), may be easily and quickly removed from the computer chassis 102 (FIG. 1).

FIG. 4 also illustrates the range of motion of the fastener 132. When the capture member 104 is in the raised position, the fastener 132, shown in phantom lines, remains attached to the capture member 104 via the boss 202. Thus, there is no risk of the fastener 132 becoming displaced or falling into the chassis. Furthermore, when the capture member 104 is in the lowered position, the fastener 132 may be engaged through the threaded aperture 134 to further secure the capture member 104 in place.

Figure 5:
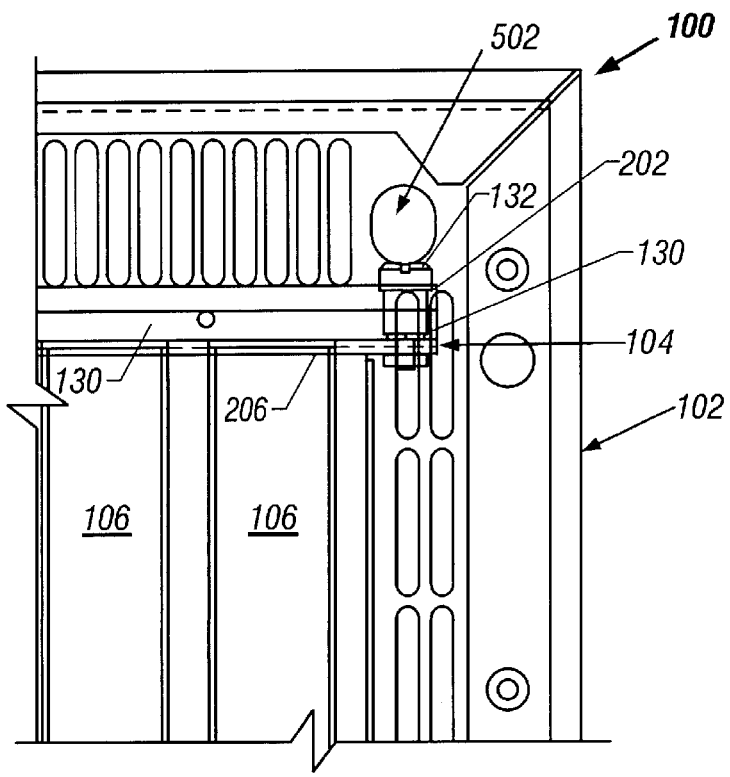
FIG. 5 is a front elevation view of the capture member of FIG. 1 with the capture member fastened to the computer chassis with a captive fastener.

FIG. 5 is a front elevation view of the capture member 104 secured to the computer chassis 102 with the capture member 104 in a lowered or closed position. As discussed above, it is in this closed or lowered position that the capture member 104 reliably secures the card brackets 106. FIG. 5 also shows a clearance hole 502 through which the fasteners 132 may extend when the capture member 104 is lifted into the raised position illustrated in FIG. 1. By allowing the fastener 132 to extend through the clearance hole 502, the chassis 102 will not interfere with the fastener 132.

Figure 6:
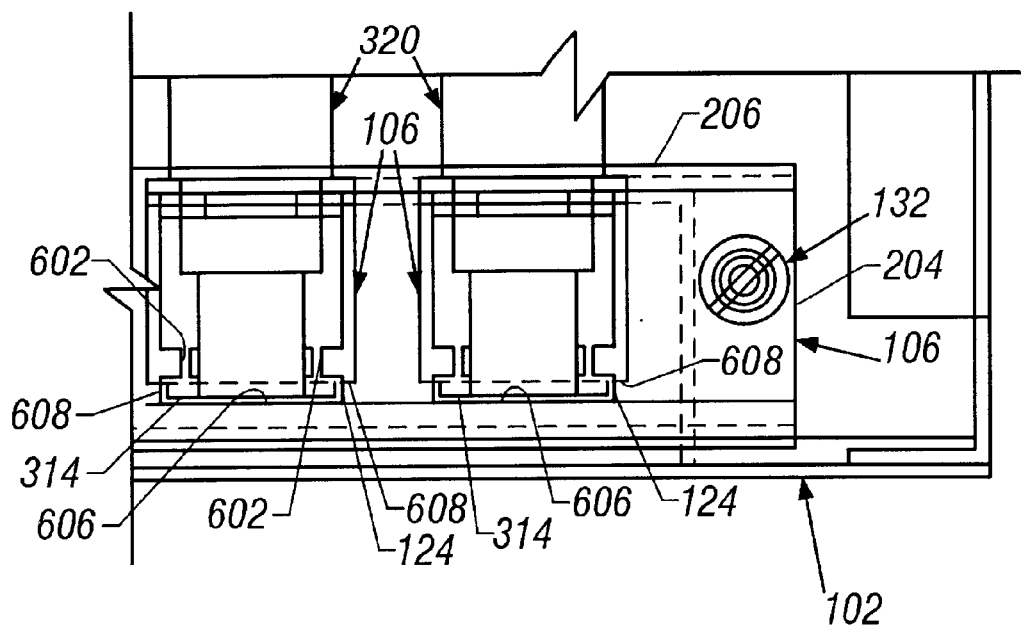
FIG. 6 is a top plan view of the capture member of FIG. 1.

FIG. 6 is a top elevation view of the assembly 100 and illustrates the manner in which the card bracket lip 314 fits within the lip aperture 124 to laterally secure the card bracket 106 within the chassis 102. As illustrated, the lip 314 has a width that is slightly less than that of the card bracket 106 and the lip aperture 124.

Figure 7:
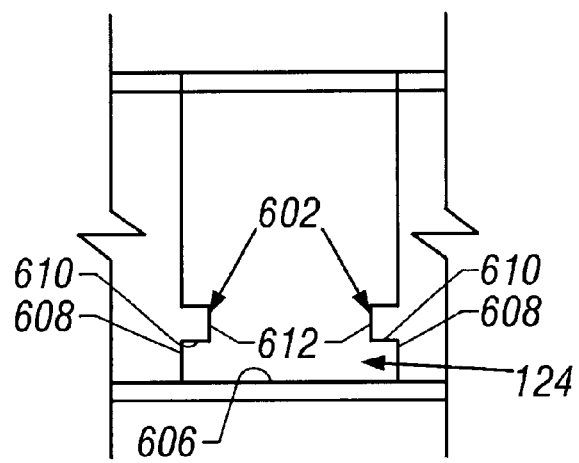
FIG. 7 is a top plan view of a lip aperture formed in the computer chassis of FIG. 1 according to the present invention.

The back edge 606 of the card slot 116, side edges 608, and the back edge 610 of the tab 602, as shown in FIGS. 6 and 7, generally define the lip aperture 124. Advantageously, the width of the lip aperture 124 between the side edges 608 is only slightly greater than the width of the lip 314 so that the lip 314 may fit securely between the side edges 608 while reducing or preventing lateral movement of the card bracket 106 in the card slot 116. Additionally, the distance between the tab inside edges 612 is less than the width of the lip 314 to further secure the lip 314 within the lip aperture 124.

Figure 8:
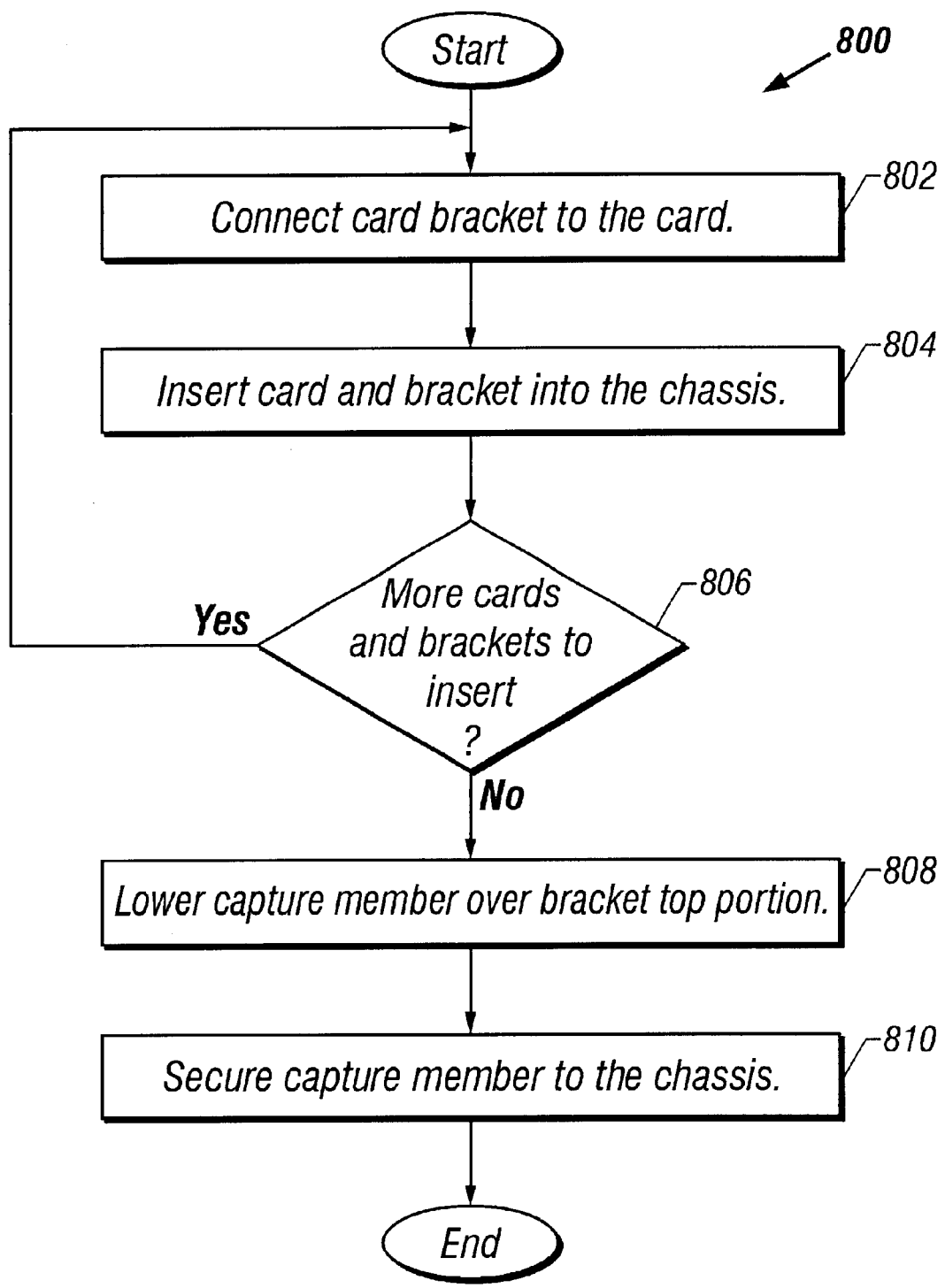
FIG. 8 is a flowchart illustrating one embodiment of a method for securing a card within a computer chassis according to the present invention.

FIG. 8 shows a flowchart of a preferred method for securing at least one card 302 (FIG. 3) within a computer chassis 102 (FIG. 1). In block 802, the card 302 is connected to a card bracket 106. Electrical connectors 320 (FIG. 3) extending from the card 302 are positioned through corresponding apertures 322 located along the base portion 310 of the bracket 106. Washers 304 and nuts 306 are then attached to the end of the connectors 320 to maintain the bracket attachment to the card 302.

Once the card 302 is secured to the bracket 106, the card 302 and bracket 106 are inserted into the computer chassis 102 in block 804. A bottom portion of the card 302 is inserted into an edge card connector 114 (FIGS. 1 and 3) mounted on the computer motherboard 110. The card bracket tab 128 (FIGS. 1 and 3), extending from a bottom end of the card bracket 106, is also positioned into a slot 126 (FIG. 1) adjacent to the edge card connector 114. Further, the card bracket lip 314 (FIG. 3) is inserted into a lip aperture 124 (FIG. 7) formed in the chassis 102 to laterally secure the card bracket 106 within the chassis 102.

If additional cards 302 and brackets 106 are to be added to the computer, then the above-discussed steps 802 and 804 are repeated in block 806. Once all cards 302 and brackets 106 are now in place, the capture member 104 is lowered over the bracket top portions 312 (FIG. 3) in block 808. Once lowered, the capture member 104 securely sandwiches the card bracket top portion 312 between the computer chassis horizontal plate 122 and the capture member arm bottom surface 404. Additionally, the retaining flange 206, extending from the arm 204 of the capture member 104, is positioned against the base portion 310 of the bracket 102 to further inhibit lateral movement of the brackets 106.

In a preferred embodiment, the capture member 104 is elongated so that the capture member 104 may simultaneously secure multiple card brackets 106 within the chassis 102. In addition, the capture member 104 is advantageously attached to the chassis 102 by a hinge 130 so that the capture member 104 may be pivotally moved into and out of engagement with the card brackets 106.

Finally in block 810, the capture member 104 is secured to the chassis 102 by at least one fastener 132 advanced into a threaded aperture 124 located on the horizontal plate 122. The fasteners 132 are preferably sized and configured with heads that enable the fasteners 132 to be hand-tightened and hand-loosened so that the use of a screwdriver to advance or withdraw the fasteners 132 is unnecessary. Since the fasteners 132 preferably comprise captive fasteners, they are maintained within the bosses 202 even when disconnected from the apertures 134 to prevent the possibility of misplacing or dropping the fasteners 132.

The removal of a card 302 secured in a computer chassis 102 by the method described in conjunction with FIG. 8 is essentially the reverse steps. That is, initially, the fasteners 132 are disconnected from the threaded apertures 134. Next, the capture member 104 is removed from the top portions 312 of the card brackets 106. In a preferred embodiment, the capture member 104 is pivotally raised from the lowered position shown in FIG. 2 to the raised position shown in FIG. 1.

Once the capture member 104 is raised out of contact with the card brackets 106, the card bracket top lip 314 is removed from the lip aperture 124 and the bottom tab 128 is removed from the slot 126 to detach the card bracket 106 from the computer chassis 102. With the card bracket 106 detached from the computer chassis 102, the card may then be disconnected from the edge card connector 114.

The invention has been described above with reference to a specific embodiment. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A system for reliably securing one or more card brackets within a computer chassis having one or more card slots, comprising:
    a capture member selectively attachable to the computer chassis for selective positioning into and out of contact with the card bracket to secure the card bracket within the computer chassis; and
    a retaining flange formed substantially perpendicular to the capture member, wherein the capture member and the retaining flange are elongated to extend over a plurality of card brackets.

2. The system of claim 1 wherein the card bracket further comprises a tab extending from an end of the base portion for securing the bracket to a slot of the chassis.

3. The system of claim 1 wherein the lip is substantially perpendicular to the end of the top portion.

4. The system of claim 1 wherein the base portion further comprises at least one connector aperture for card connectors of a computer card to extend therethrough.

5. The system of claim 1 wherein the capture member further comprises at least one captive fastener disposed in a boss, wherein the boss prevents the fastener from detaching from the capture member.

6. The system of claim 5 wherein at least one fastener comprises a head which enables advancing and retracting of the fastener by hand.

7. The system of claim 1 wherein the capture member is pivotally attached to the chassis with a hinge.

8. A system for securing a card bracket within a computer chassis having a card slot, the system comprising:
    an elongated capture member selectively secured to the computer chassis for selective positioning between open and closed positions, the capture member being disposed proximal to the card slot for securing the card bracket adjacent the card slot when the capture member is positioned in the closed position, wherein the capture member comprises an arm and a retaining flange formed substantially perpendicular to the arm, the arm and the retaining flange being elongated to extend over a plurality of card brackets; and
    at least one fastener for fastening the capture member to the chassis to maintain the capture member in the closed position.

9. The system of claim 8 wherein the capture member is pivotally attached to the chassis with a hinge.

10. The system of claim 8 wherein at least one captive fastener is disposed in a boss, the boss preventing the fastener from detaching from the capture member.

11. The system of claim 8 wherein at least one fastener comprises a head which enables advancing and retracting of the fastener by hand.

12. A method for reliably securing multiple card brackets within a computer chassis, comprising the steps of:
    coupling the multiple card brackets to the chassis;
    positioning an elongated capture member in contact with the multiple card brackets;
    placing a retaining flange of the capture member against a back surface of the bracket; and
    securing the elongated capture member to the chassis over the card brackets to reliably secure the card brackets within the computer chassis.

13. The method of claim 12 wherein the step of coupling further comprises inserting a tab extending from a base portion of the bracket through a slot in the chassis.

14. The method of claim 12 wherein the step of coupling further comprises inserting a portion of a card attached to the card bracket into an edge card connector mounted on a motherboard of the chassis.

15. The method of claim 12 wherein the step of coupling further comprises inserting a lip extending from a top portion of the card bracket through a lip aperture in the chassis.

16. The method of claim 12 wherein the step of positioning further comprises the step of pivoting the capture member along a hinge connecting the capture member to the chassis.

17. The method of claim 12 wherein the step of securing further comprises advancing at least one fastener through a threaded aperture in the chassis.

18. The method of claim 17 further comprising the step of advancing the fastener by rotating a head of the fastener by hand.

19. A system for reliably securing multiple card brackets within a computer chassis comprising:
    means for coupling the multiple card brackets to the chassis;
    means for positioning an elongated capture member in contact with the multiple card brackets;
    means for placing a retaining flange of the capture member against a back surface of the bracket; and
    means for securing the elongated capture member to the chassis over the card brackets to reliable secure the card brackets within the computer chassis.

20. The system of claim 5 further comprising a card bracket having a top portion, a base portion, and a lip extending at an angle from an end of the top portion for mounting a computer card in the card slot formed in the computer chassis.

21. A card bracket for securing a computer card with one or more threaded connectors within a computer chassis, the card bracket comprising:
    a top portion having a lip, the lip being configured to fit within a lip aperture formed in the computer chassis; and
    a base portion extending from the top portion opposite the lip, the base portion and the top portion being oriented in a substantially perpendicular relationship to each other, the base portion including
        a tab configured to fit within a slot formed in the computer chassis, and
        at least one connector aperture, wherein the card bracket is secured to the computer card by extending the threaded connector through the connector aperture and fastening a corresponding threaded nut to the threaded connector.

* * * * *